United States Patent
Tsutsui

(10) Patent No.: US 11,984,468 B2
(45) Date of Patent: May 14, 2024

(54) SOLID-STATE IMAGING DEVICE COMPRISING ELEMENT ISOLATION LAYER WITH LIGHT-SHIELDING PROPERTIES AND CHARGE TRAPPING LAYER

(71) Applicants: TOWER PARTNERS SEMICONDUCTOR CO., LTD., Toyama (JP); TOWER SEMICONDUCTOR LTD., Migdal Haemek (IL)

(72) Inventor: Masafumi Tsutsui, Toyama (JP)

(73) Assignees: TOWER PARTNERS SEMICONDUCTOR CO., LTD., Uozu (JP); TOWER SEMICONDUCTOR LTD., Migdal Haemek (IL)

( * ) Notice: Subject to any disclaimer, the term of this patent is extended or adjusted under 35 U.S.C. 154(b) by 0 days.

(21) Appl. No.: 17/793,489

(22) PCT Filed: May 28, 2021

(86) PCT No.: PCT/JP2021/020344
§ 371 (c)(1),
(2) Date: Jul. 18, 2022

(87) PCT Pub. No.: WO2021/241722
PCT Pub. Date: Dec. 2, 2021

(65) Prior Publication Data
US 2023/0071740 A1    Mar. 9, 2023

(30) Foreign Application Priority Data
May 28, 2020   (JP) ................ 2020-093348

(51) Int. Cl.
*H01L 27/148*   (2006.01)
*H01L 21/76*   (2006.01)
(Continued)

(52) U.S. Cl.
CPC ........ *H01L 27/14818* (2013.01); *H01L 21/76* (2013.01); *H01L 21/762* (2013.01);
(Continued)

(58) Field of Classification Search
CPC . H01L 27/14818; H01L 21/76; H01L 21/762; H01L 27/146; H01L 27/1463; H04N 25/70
See application file for complete search history.

(56) References Cited

U.S. PATENT DOCUMENTS

2014/0131779 A1    5/2014  Takeda
2014/0327051 A1*  11/2014  Ahn .................. H01L 31/18
                                                           438/69

(Continued)

FOREIGN PATENT DOCUMENTS

| JP | 2014-096490 A | 5/2014 |
| JP | 2018-160486 A | 10/2018 |
| WO | 2018/173789 A1 | 9/2018 |

*Primary Examiner* — Jennifer D Bennett
(74) *Attorney, Agent, or Firm* — Maschoff Brennan

(57) ABSTRACT

A solid-state imaging device includes a pixel array where pixels are arranged in a matrix. Each of the pixels includes a photoelectric conversion unit configured to generate a signal charge based on incident light, and an element isolation layer having light-shielding properties and surrounding a periphery of the photoelectric conversion unit. The element isolation layers of adjacent ones of the pixels in a row direction and a column direction are isolated from each other. A charge storage layer and a charge trapping layer are provided in each of regions between the element isolation layers of the adjacent ones of the pixels in the row direction and the column direction. The charge storage layer stores the (Continued)

signal charge. The charge trapping layer reduces incidence of light on the charge storage layer.

15 Claims, 9 Drawing Sheets

(51) Int. Cl.
    *H01L 21/762*     (2006.01)
    *H01L 27/146*     (2006.01)
    *H04N 25/70*     (2023.01)

(52) U.S. Cl.
    CPC ........ *H01L 27/146* (2013.01); *H01L 27/1463* (2013.01); *H04N 25/70* (2023.01)

(56) References Cited

U.S. PATENT DOCUMENTS

| | | |
|---|---|---|
| 2016/0118422 A1 | 4/2016 | Takeda |
| 2018/0026062 A1 | 1/2018 | Takeda |
| 2018/0366500 A1 | 12/2018 | Takeda |
| 2020/0013808 A1 | 1/2020 | Kumagai |
| 2021/0217787 A1 | 7/2021 | Kumagai |

* cited by examiner

SOLID-STATE IMAGING DEVICE COMPRISING ELEMENT ISOLATION LAYER WITH LIGHT-SHIELDING PROPERTIES AND CHARGE TRAPPING LAYER

TECHNICAL FIELD

The present disclosure relates to a solid-state imaging device.

BACKGROUND ART

In smartphones, digital cameras, and other devices, solid-state imaging devices are used to acquire images. As a shutter method of a solid-state imaging device, providing a charge holding unit in each pixel and reading pixel signals simultaneously from all pixels (global shutter method) is known. Providing an element isolation layer with light-shielding properties and a charge trapping region is also known to reduce the leakage of light into the charge holding unit (Patent Document 1).

CITATION LIST

Patent Document

Patent Document 1: Japanese Unexamined Patent Publication No. 2018-160486

SUMMARY OF THE INVENTION

Technical Problem

The present disclosure achieves a solid-state imaging device in which isolation of a well is not degraded in a pixel array provided with a charge trapping layer.

Solution to the Problem

A solid-state imaging device includes a pixel array where pixels are arranged in a matrix. Each of the pixels includes a photoelectric conversion unit configured to generate a signal charge based on incident light, and an element isolation layer surrounding a periphery of the photoelectric conversion unit. The element isolation layers of adjacent ones of the pixels in both a row direction and a column direction are isolated from each other. A charge storage layer for storing a signal charge and a charge trapping layer for reducing incidence of light on the charge storage layer are provided in each of regions between the element isolation layers of the adjacent ones of the pixels.

Advantages of the Invention

The solid-state imaging device according to the present disclosure allows excellent isolation of a well, even when pixels are arranged in a matrix and provided with a charge trapping layer.

DESCRIPTION OF EMBODIMENTS

First Embodiment

Figure 1:
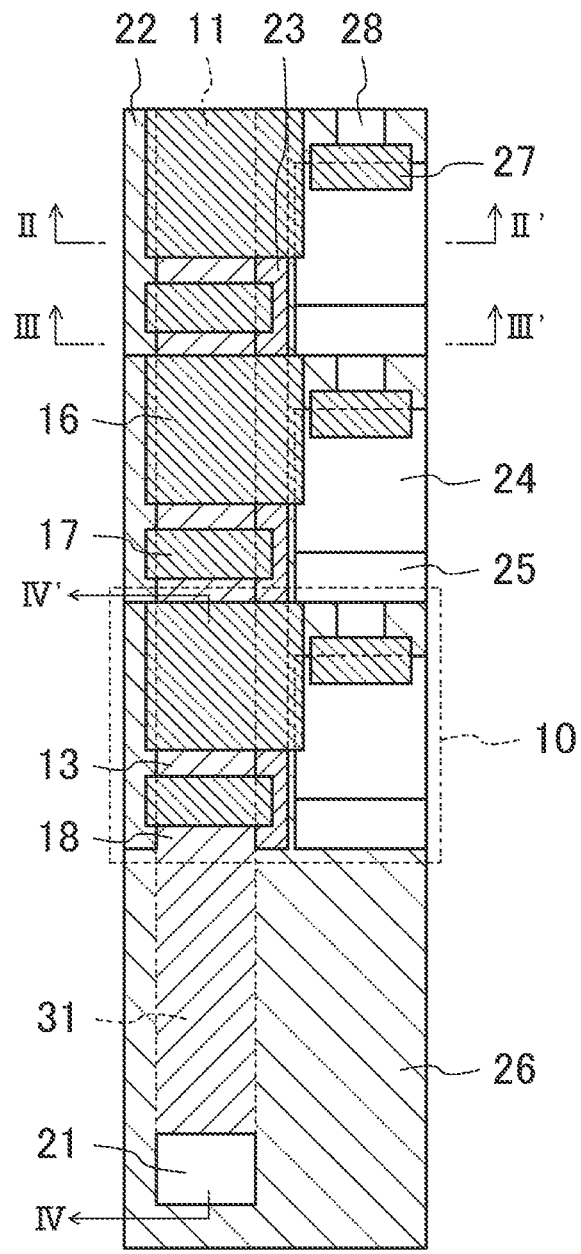
FIG. 1 is a plan view illustrating how a connection is made with a charge trapping layer in a region outside a pixel array, in a solid-state imaging device that includes the charge trapping layer for each pixel.
Figure 2:
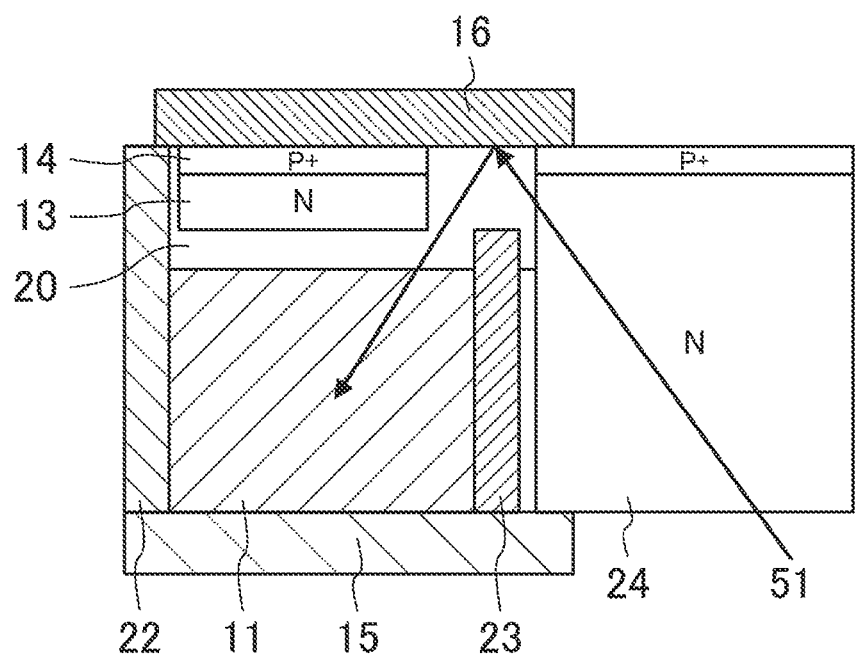
FIG. 2 is a cross section taken along line II-II' in FIG. 1.
Figure 3:
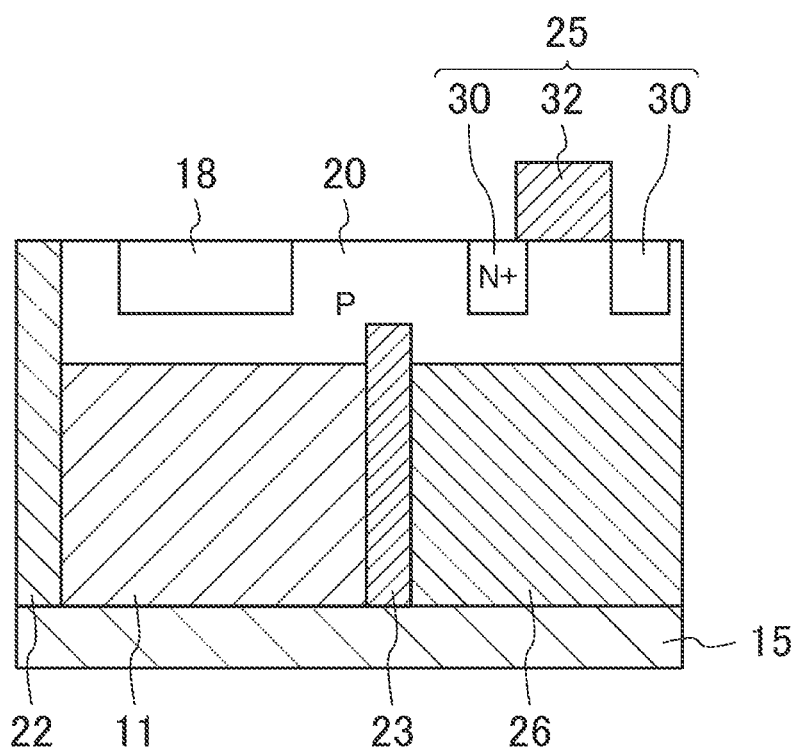
FIG. 3 is a cross section taken along line in FIG. 1.
Figure 4:
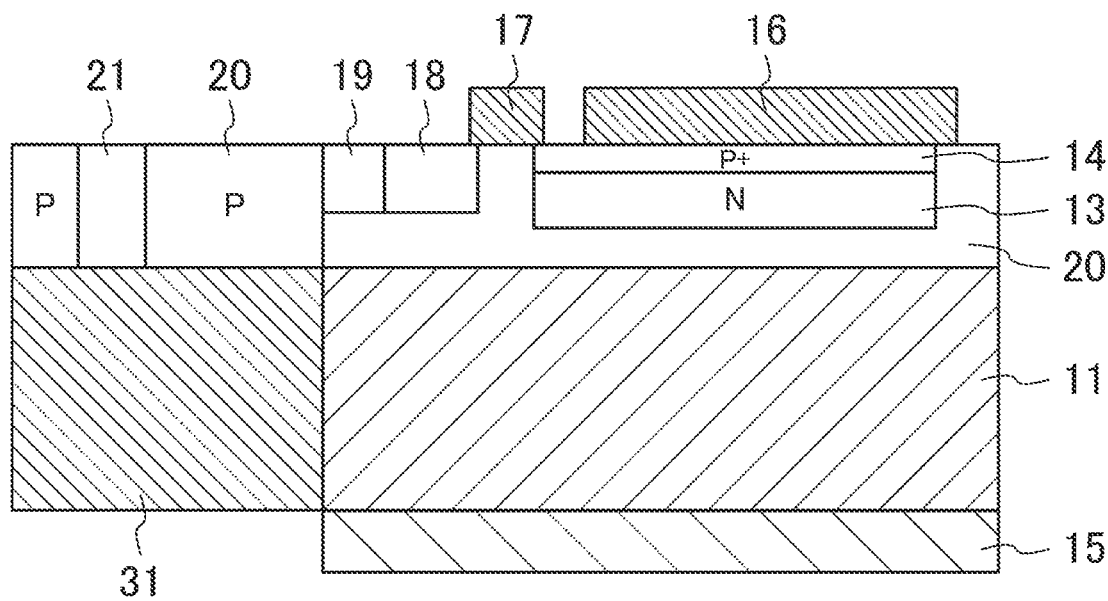
FIG. 4 is a cross section taken along line IV-IV' in FIG. 1.

Embodiments of the present disclosure will be described below with reference to the drawings. FIG. 1 schematically shows a planar layout of an exemplary solid-state imaging device. FIGS. 2, 3, and 4 are schematic cross-sectional views taken along lines and IV-IV' in FIG. 1.

FIG. 1 shows three pixels 10 arranged vertically in the figure, one of which is surrounded by a broken line. More pixels 10 may be arranged vertically, or pixels 10 may also be arranged horizontally to form a matrix pixel array.

Each pixel 10 includes an N-type photoelectric conversion unit 24 (e.g., made of a photodiode) that photoelectrically converts incident light to generate signal charges, an overflow drain 28 capable of discharging the charges of the photoelectric conversion unit 24, and an overflow gate 27 that controls the movement of the charges to the overflow drain 28. In addition, a plurality of transistors 25 are arranged such that each of the transistors 25 is on the side of the photoelectric conversion unit 24 opposite to the overflow drain 28. The transistors 25 are used for the pixels 10 to control readout of charges, reset, and selection of a pixel to be read, for example.

As shown in FIG. 2, the photoelectric conversion unit 24 serves as an N-type region in the substrate, and includes, as a P-type layer 14 with a small thickness, a front-side passivation layer on the photoelectric conversion unit 24 (a substrate surface portion) in the cross section. Laterally apart from the photoelectric conversion unit 24, an N-type charge storage layer 13 (memory node) is provided near the substrate surface in a P-well 20. The P-type layer 14 with the small thickness is also provided on the charge storage layer 13. The exemplary solid-state imaging device is of a backside illumination type in which light enters from below in the figure (indicated by an arrow 51).

Provided on the substrate is a first transfer gate 16 that controls the movement of signal charges from the photoelectric conversion unit 24 to the charge storage layer 13.

A charge trapping layer 11 is provided below the charge storage layer 13 with the P-well 20 interposed therebetween. Provided on both sides of the charge trapping layer 11 are element isolation layers (deep trench isolation (DTI) regions) with light-shielding properties. More specifically, in one pixel 10, a non-through DTI region 23, which reaches the lower end of the substrate but does not reach the upper end, is provided between the charge storage layer 13 and the photoelectric conversion unit 24. The element isolation layer in this location is the non-through DTI region 23 in order to provide a path for moving charges from the photoelectric conversion unit 24 to the charge storage layer 13. On the other hand, a through DTI region 22 reaching both the upper and lower ends of the substrate is provided on the side (at the end of the pixel 10) of the charge trapping layer 11 opposite to the photoelectric conversion unit 24.

A backside light-shielding film 15 is provided for the charge trapping layer 11 so as to cover the back surface side of the substrate.

The through DTI region 22, the non-through DTI region 23, and the backside light-shielding film 15 reduce the incidence of light on the charge storage layer 13 which is a memory node. The light incident from the back surface side may leak through the non-through DTI region 23. However, light takes a path that makes the light reflected on the front surface side of the substrate (the back side of the first transfer gate 16 as an example in the drawing) as indicated by the arrow 51; therefore, such light is mostly incident on the charge trapping layer 11. As a result, the leakage light is photoelectrically converted in the charge trapping layer 11, and is less mixed with the signal charges of the charge storage layer 13.

As described above, the charge trapping layer 11 is capable of reducing the leakage of light into the charge storage layer 13 (or addition of charges derived from the leakage light to the signal charges) and reducing deterioration of image quality.

The signal charges stored in the charge storage layer 13 are transferred to a floating diffusion 18. In order to control this, a second transfer gate 17 is provided. FIG. 3 shows a cross section taken along the line passing over the floating diffusion 18. Also in the cross-section in FIG. 3, the through DTI region 22 and the non-through DTI region 23 are provided on respective sides of the charge trapping layer 11. A P-type deep well region 26 for isolating the photoelectric conversion units 24 of the pixels 10 from each other is provided in a region on the side of the non-through DTI region 23 opposite to the charge trapping layer 11. The backside light-shielding film 15 is provided for the deep well region 26, as well. A transistor including an N+ layer 30, which is a source or drain region, and a gate electrode 32 is formed on the front surface side with respect to the deep well region 26.

The first transfer gate 16, the second transfer gate 17, the charge storage layer 13, the floating diffusion 18, and other elements are also shown in FIG. 4 which is a cross-sectional view taken along line IV-IV' in FIG. 1. On the side of the floating diffusion 18 opposite to the second transfer gate 17, a shallow trench isolation (STI) region 19 is provided as an element isolation region. In addition, the charge trapping layer 11 includes an extension region 31 extended to a region outside the region (pixel array) where the pixels 10 are arranged (see FIGS. 1 and 4). The extension region 31 includes, on the front surface side of the substrate, a terminal 21 for making an electrical connection with the charge trapping layer 11.

The extension region 31 eliminates the need to provide a terminal for the charge trapping layer 11 in the pixel array. This increases the layout flexibility and contributes to reduction in the area of the pixel array.

Second Embodiment

Next, an example will be described where pixels 10 are arranged in a matrix (two dimensionally), and a charge trapping layer 11 and other elements are interposed between the pixels 10 in both the row and column directions.

Figure 5:
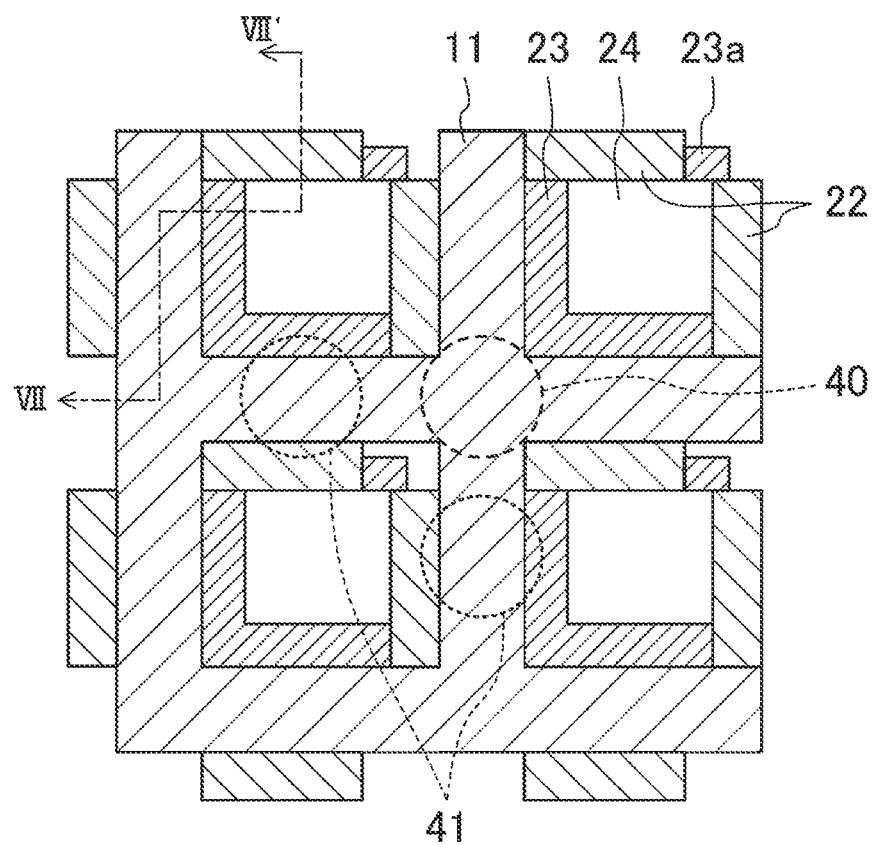
FIG. 5 is a plan view showing an example of a solid-state imaging device in which pixels are arranged in a matrix and a plurality of charge trapping layers are provided for each pixel.

FIG. 5 is a plan view schematically showing four pixels 10 in total arranged in two rows and two columns as representatives of a large number of pixels 10 arranged in a matrix. Also in this case, each pixel 10 includes a photoelectric conversion unit 24 which is surrounded by the element isolation layer with light-shielding properties. More specifically, through DTI regions 22 are provided on two adjacent sides (upper and right sides in FIG. 5) of the photoelectric conversion unit 24 in a substantially rectangular shape, and non-through DTI regions 23 are provided on the other two sides (left and lower sides in FIG. 5). The non-through DTI regions 23 on the two sides are connected to each other to form an L-shape, whereas the through DTI regions 22 on the two sides are isolated from each other, with a non-through DTI region 23a, which occupies a small area, being provided in the gap therebetween (at the upper right corner of each photoelectric conversion unit 24 in FIG. 5).

FIG. 5 also shows the charge trapping layer 11 between the pixels 10. As shown in FIG. 5, the element isolation layer surrounding the photoelectric conversion unit 24 is provided individually for each pixel 10. That is, the element isolation layers (the through DTI regions 22 and the non-through DTI regions 23) are not connected to each other between the adjacent pixels 10. The charge trapping layer 11 is provided in such a region between the pixels (between the element isolation layers). The charge trapping layer 11 is provided between the pixels in both the row and column directions. Accordingly, the charge trapping layer 11 may be provided as a lattice region extending vertically and horizontally (i.e., in the row and column directions).

Figure 6:
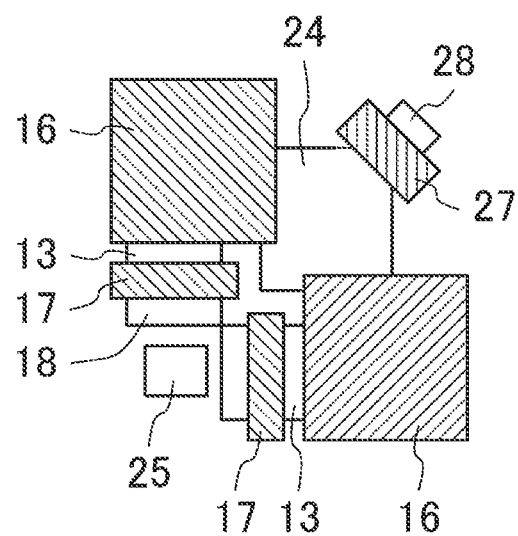
FIG. 6 is a diagram illustrating an arrangement of a gate electrode and other elements, with respect to a photoelectric conversion unit in the solid-state imaging device in FIG. 5.
Figure 7:
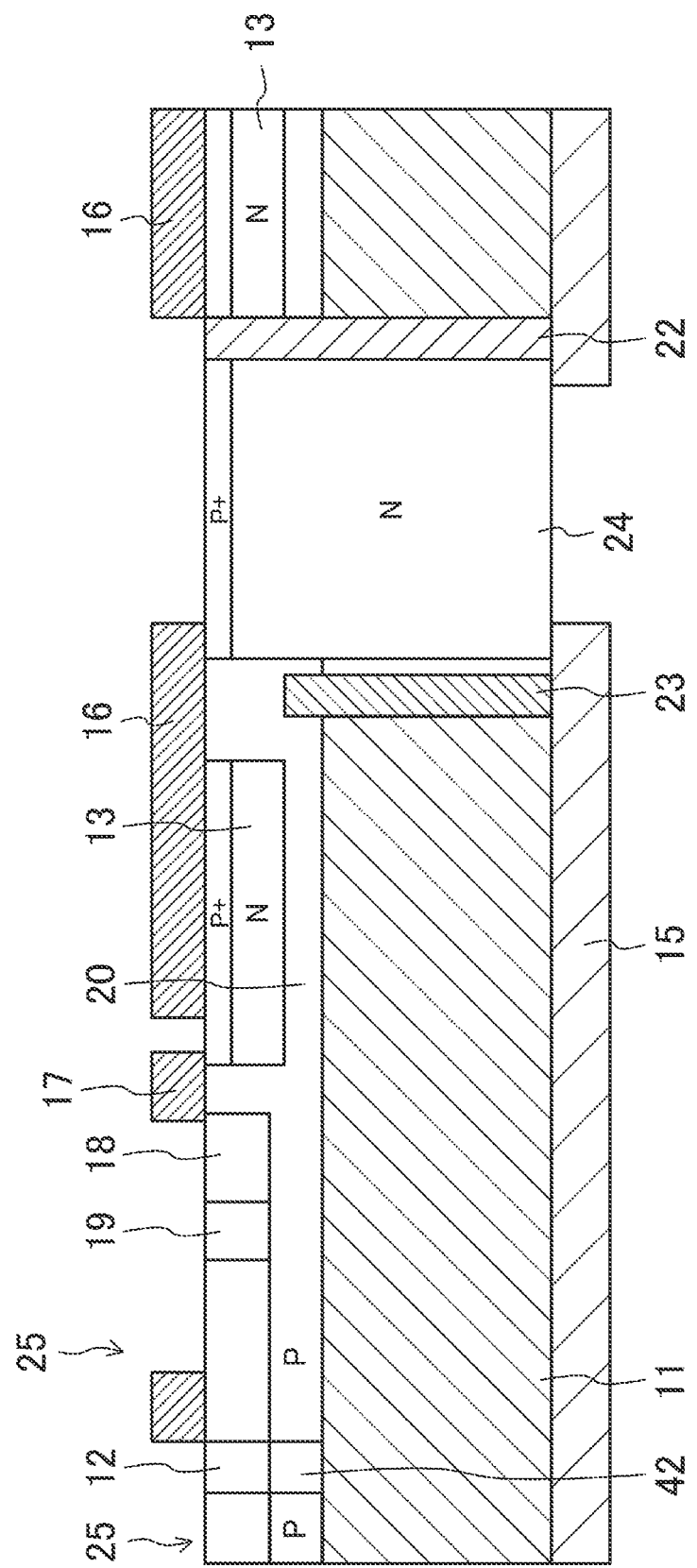
FIG. 7 is a cross section taken along line VII-VII' in FIG. 5.

Next, FIG. 6 shows a configuration related to the transfer of signal charges generated in the charge trapping layer 11. FIG. 7 shows a cross section taken along the line VII-VII' in FIG. 5.

The cross-sectional structure of each pixel 10 according to this embodiment is similar to that shown in FIGS. 2, 3, and 4. As shown in FIG. 7, the photoelectric conversion unit 24 serves as an N-type region in the substrate, and includes a P+ type layer with a small thickness on the photoelectric conversion unit 24 (a substrate surface portion) in the cross section. An N-type charge storage layer 13 (memory node) is provided near the substrate surface in a P-well 20, laterally apart from the photoelectric conversion unit 24 with the non-through DTI region 23 interposed therebetween. A P-type layer with the small thickness is also provided on the charge storage layer 13. Provided on the substrate is a first transfer gate 16 that controls the movement of signal charges from the photoelectric conversion unit 24 to the charge storage layer 13. Further provided are a floating diffusion 18 to which signal charges are transferred from the charge storage layer 13, and a second transfer gate 17 that controls this transfer. On the side of the floating diffusion 18 opposite to the second transfer gate 17, an STI region 19 is provided as an element isolation region. Further, a transistor 25, a VDD region 12, and another transistor 25 are arranged sequentially. Each of the transistors 25 may include a plurality of transistors. A region 42 where no P-well is formed is provided under the VDD region 12.

The charge trapping layer 11 is provided below the charge storage layer 13, the floating diffusion 18, and other elements with the P-well 20 interposed therebetween. A backside light-shielding film 15 is provided below the charge storage layer 13 so as to cover the back surface of the substrate. The backside light-shielding film 15 has an opening at a portion corresponding to the photoelectric conversion unit 24.

As indicated by the line VII-VII' in FIG. 5, the cross-sectional configuration described above illustrates mainly a region between pixels arranged in the row direction (the side-to-side direction in FIG. 5). However, a similar configuration is also provided between pixels arranged in the column direction (up-down direction in FIG. 5). In other words, one pixel 10 includes two charge storage layers 13, two first transfer gates 16, two second transfer gates 17, and two floating diffusions 18, for example. These arrangements are shown in FIG. 6. FIG. 7 shows the charge trapping layer 11, the charge storage layer 13, and other elements on the side of the photoelectric conversion unit 24 opposite to the through DTI region 22 (corresponding to the upper side of the photoelectric conversion unit 24 in FIG. 6) as well.

For the photoelectric conversion unit 24, an overflow drain 28 capable of discharging charges of the photoelectric conversion unit 24 and an overflow gate 27 that controls the movement of the charges to the overflow drain 28 are provided in a part (on the upper right in FIG. 6) between the through DTI regions 22.

The configuration described above allows arrangement of a plurality of (here, two) charge storage layers 13 for each pixel 10 in a solid-state imaging device including a pixel array where the pixels 10 are arranged in a matrix. Accordingly, the solid-state imaging device can be used as a time-of-flight (TOF) sensor, for example, to acquire distance information of a target to be imaged.

The leakage of light into the plurality of charge storage layers 13 provided for each pixel can be reduced by the respectively provided charge trapping layers 11, and thus can reduce the deterioration of image quality.

However, the configuration as in the plan view in FIG. 5 may have the following problem.

In the configuration shown in FIG. 5, the charge storage layers 13 are provided in regions 41 between two adjacent pixels 10 in the row and column directions. This means the problem does not occur as long as the charge trapping layers 11 are provided similarly in the regions 41. However, in the case of FIG. 5, the charge trapping layer 11 is formed also in an intersection region 40 (i.e., the central region of four (2×2) pixels) in which a region extending between columns of the pixels 10 and a region extending between rows of the pixels 10 intersect each other.

The charge trapping layer 11 is formed by impurity injection, for example. Here, the element isolation layer (e.g., the through DTI region 22 and the non-through DTI region 23) with light-shielding properties induces negative charges and thereby reduces dark currents of the photoelectric conversion unit 24. Thus, in order for the charge trapping layer 11 to obtain desired potentials, impurity injection at a predetermined concentration is necessary. For example, in a case of forming an N-type charge trapping layer 11 in a P-well 20, N-type impurities are injected to sufficiently reduce the potential.

Suppose that the injection is performed in the region extending continuously between the columns of the pixels 10 and the region extending continuously between the rows of the pixels 10 to form the charge trapping layers 11. In this case, the injection is performed twice in the intersection region 40, that is, the impurities are injected at a higher concentration in the intersection region 40. As a result, the impurity concentration in the intersection region 40 increases and the potential drops too much, thereby causing weaker (degraded) isolation of the P-well 20.

In addition, around the intersection region 40, there is no element isolation layer that induces negative charges. For this reason, even if the injection is performed simultaneously without being performed twice, the potential drops too much in the intersection region 40, thereby causing weaker (degraded) isolation of the P-well 20.

In the P-well 20, various transistors are formed which are necessary for the operation of the pixel 10. A degraded isolation of the P-well 20 causes the disadvantages, such as those in which the threshold voltages of the transistors vary, or in which the respective source/drain regions are short-circuited via the charge trapping layers 11, whereby the transistors fail to operate.

Figure 8:
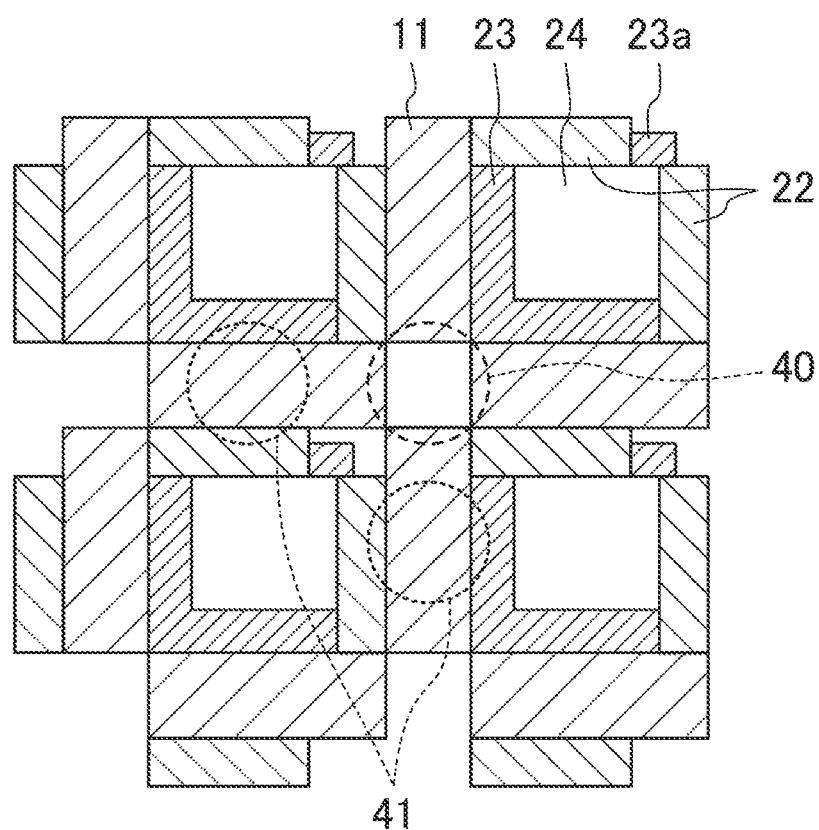
FIG. 8 is a diagram illustrating another example pattern in an intersection region of the charge trapping layers.

In order to address the disadvantages, the position of the charge trapping layer 11, the concentration of the impurities to be introduced to form the charge trapping layer 11 at that position, and other conditions are set. FIG. 8 is a plan view of an example of such measures.

In the example in FIG. 8, charge trapping layers 11d are located in the regions 41 between two adjacent pixels 10 (regions between through DTI regions 22 and non-through DTI regions 23 included in respective pixels). No charge trapping layer is located in the intersection region 40. This is achieved by setting regions where impurities are injected.

This configuration avoids a situation in which the potential drops too much in the intersection region 40, and enables reliable isolation of the P-well 20. In this case, the charge trapping layers 11d between the pixels 10 are not continuous but discontinuous in the row and column directions. Alternatively, the charge trapping layers 11d may be weakly continuous only at the four corners of the intersection region 40.

Figure 9:
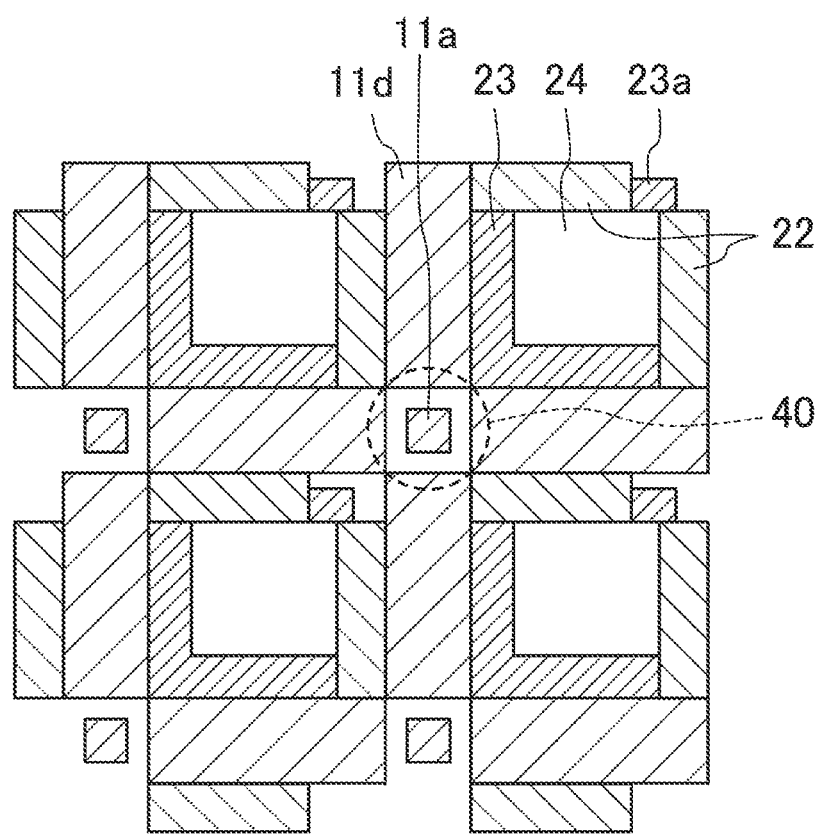
FIG. 9 is a diagram illustrating still another example pattern in the intersection region of the charge trapping layers.

FIG. 9 shows another example. In the example in FIG. 9, in addition to the configuration in FIG. 8, a small charge trapping layer 11a is provided only in a part of the intersection region 40. In other words, the occupied area of a charge trapping layer 11a is smaller than the area of the intersection region 40. The charge trapping layer 11a is not connected to the charge trapping layers 11d between the pixels 10 in the row and column directions. Accordingly, the potential can be adjusted to a desired level in the intersection region 40, and the leakage of light into the photoelectric conversion unit 24 can be reduced to a certain degree.

Figure 10:
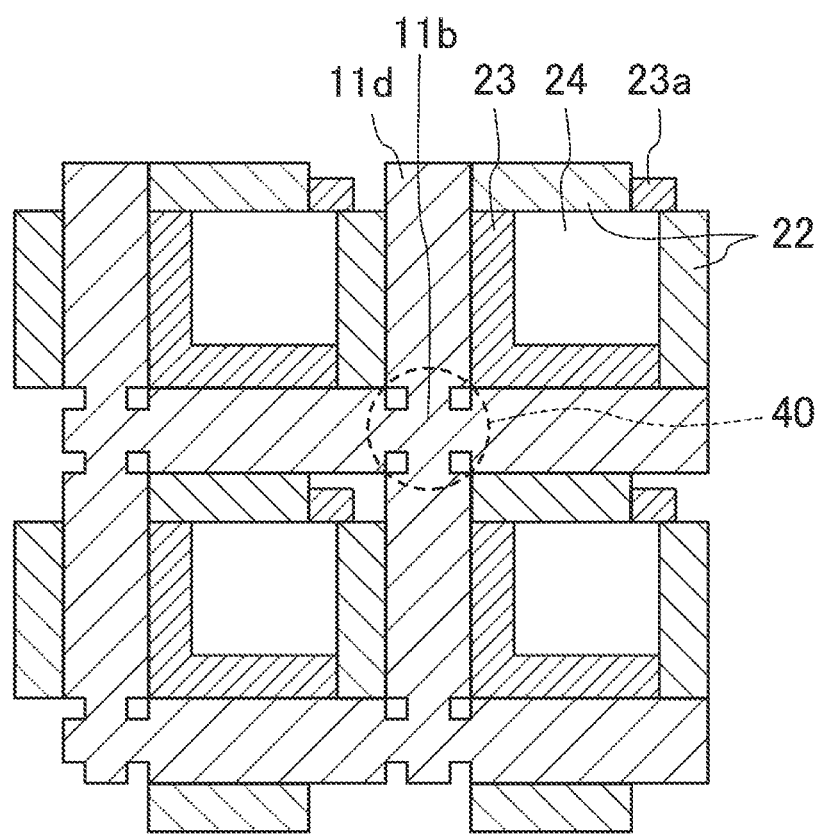
FIG. 10 is a diagram illustrating yet another example pattern in the intersection region of the charge trapping layers.

FIG. 10 shows still another example. In the example in FIG. 10 as well, a charge trapping layer 11b is provided only in a part of the intersection region 40. However, the charge trapping layer 11b is in a cross-shaped pattern and is continuous, in the row and column directions, to the charge trapping layers 11d between the element isolation layers with the light-shielding properties. Accordingly, similarly to the example in FIG. 9, the potential can be adjusted to a desired level in the intersection region 40, and the leakage of light into the photoelectric conversion unit 24 can be reduced to a certain degree. This configuration also makes it possible to connect the charge trapping layers 11d to one another and make the charge trapping layers 11d to be electrically continuous in the row and column directions.

Also in the case of providing the charge trapping layers 11 as shown in FIG. 5, the concentration of the impurities in the intersection region 40 is reduced to form a low-concentration charge trapping layer, thereby enabling adjustment of the potential.

(Electrical Connection with Charge Trapping Layers)

Figure 11:
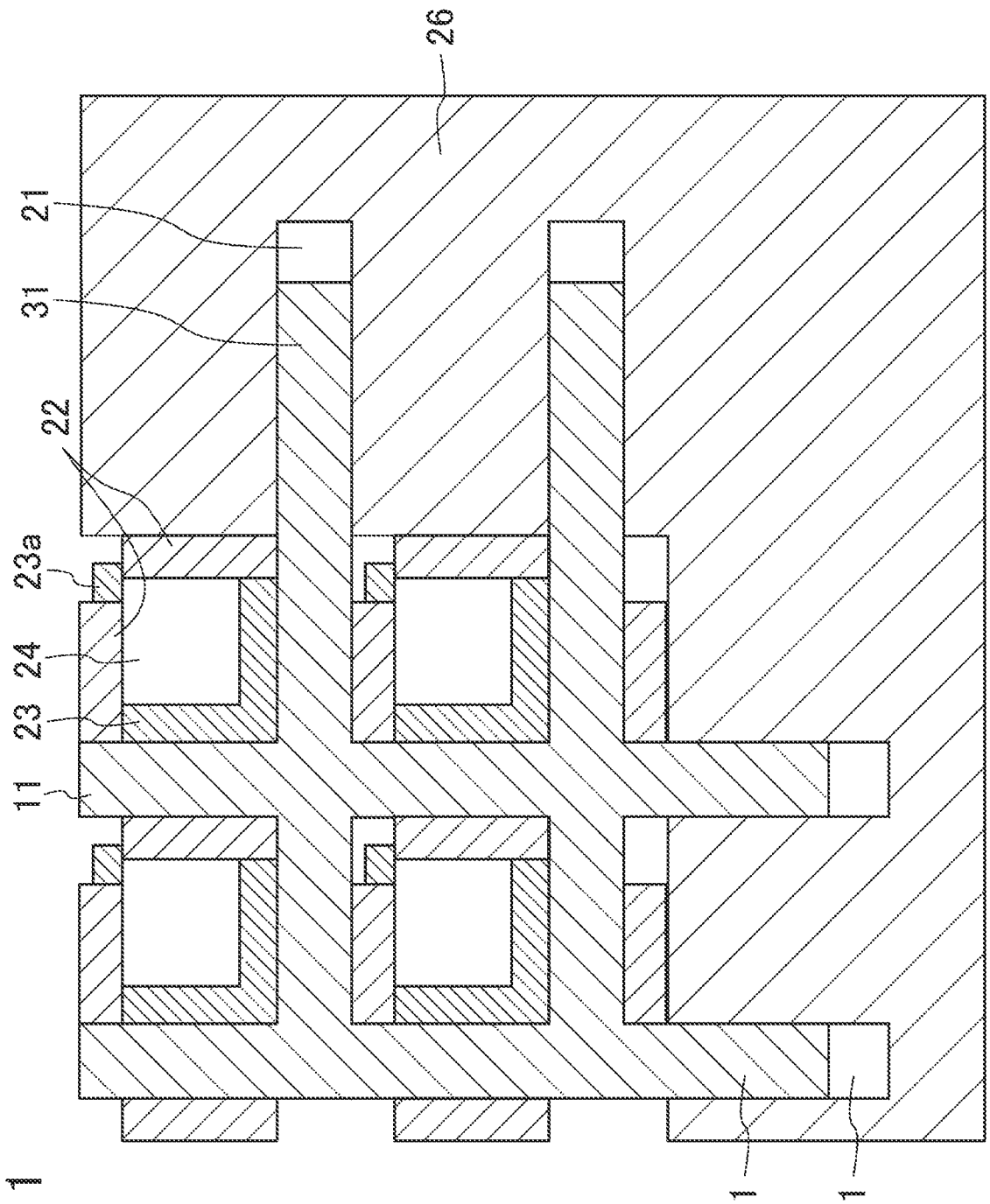
FIG. 11 is a diagram illustrating a configuration in which the charge trapping layers are extended in row and column directions in the layout in FIG. 5.

Next, an example of this embodiment will be described in which a terminal for providing an electrical connection with the charge trapping layer 11 is arranged in a region outside the pixel array. FIG. 11 is a diagram showing a modification of the layout in FIG. 5 additionally including extension regions 31 as extensions of the charge trapping layers 11 in the row and column directions. The longitudinal cross section of each of the extension regions 31 is the same as or similar to that in FIG. 4. The P-type deep well region 26 is provided around the extension regions 31. Each extension region 31 includes, on the front surface side of the substrate, a terminal 21 for making an electrical connection with the charge trapping layer 11.

These extension regions 31 eliminate the need to provide a terminal for the charge trapping layer 11 in the pixel array. This increases the layout flexibility and contributes to reduction in the area of the pixel array.

(Method of Manufacturing Solid-State Imaging Device)

The solid-state imaging device according to the present disclosure is manufactured, for example, as follows (see e.g., FIGS. 2, 3, and 4).

In order to manufacture the solid-state imaging device, an N-type epitaxial substrate or a P-type epitaxial substrate is used. The deep well region 26 for isolating the photodiodes (i.e., the photoelectric conversion units 24) of the pixels 10 is formed in the epitaxial substrate. For this purpose, a mask is formed on the substrate by resist deposition and pattern formation by lithography, and ion implantation is performed.

Next, an STI region (e.g., the STI region 19 in FIG. 4) filled with an insulating film is formed on the front surface side of the substrate to isolate regions, such as the photoelectric conversion unit 24, the memory node (the charge storage layer 13), the transistors 25, and other elements.

Subsequently, P-type impurities and N-type impurities are respectively implanted to form the P-well 20 and the charge storage layer 13. As necessary, injection for adjusting threshold voltages Vth of the transistors is performed. In any case, resist patterning is performed to implant ions into necessary regions. However, portions where no implantation for forming the P-well is performed are left in the regions to be the charge trapping layers (11, 11a, 11b, and 11d) in order to form terminals on the surface.

P-type impurities are ion-implanted into the front surface side of the charge storage layer 13 to form the front-side passivation layer (i.e., P-type layer 14).

After annealing to activate the implanted impurities, an oxide film is formed. Further, a polysilicon layer is deposited and patterned by etching to form a gate structure. The gate structure includes various gates, such as the gates of the transistors 25, the first transfer gate 16, the second transfer gate 17, and the overflow gate 27.

High-concentration P-type impurities are injected into the front surface side of the photodiode (i.e., the photoelectric conversion unit 24) to form the front-side passivation layer.

A silicon nitride film and a silicon oxide film are sequentially deposited on the substrate including the gates to form a laminated film. The laminated film is etched to form a sidewall structure covering a sidewall of the gate structure.

High-concentration N-type impurities are injected to form the source/drain regions (e.g., the N+ layers 30) of the respective transistors, the floating diffusion 18, and the terminals 21 of the charge trapping layers 11. At this time, resist patterning may be performed, so that the resist may be used as a mask.

In order to supply a potential to the P-well 14, high-concentration P-type impurities are injected, which is not shown in the drawing. Also in this case, resist patterning, for example, may be performed, so that ion implantation may be performed in divided regions.

After that, annealing is performed again to activate the impurities.

Deposition of an insulating film, formation of contacts and vias, metal filling, and other processes are performed to form an interconnect layer (not shown).

Through the steps described above, a pixel array is formed on the substrate (except for the element isolation layers with light-shielding properties, such as the through DTI region 22 and the non-through DTI region 23). The substrate is bonded to another support substrate, with an insulating film, for example, interposed therebetween. After that, the back surface side (i.e., the side opposite to the charge storage layer 13, for example) of the substrate is thinned by etching or other methods so that the substrate has a predetermined thickness (e.g., about 3 µm to about 10 µm).

Subsequently, resist patterning is performed, and holes (or trenches) for forming the through DTI region 22, the non-through DTI region 23, and other elements are formed by etching. In addition, an oxide film, and a hafnium oxide and an aluminum oxide with negative fixed charges, for example, are deposited to fill the formed trenches and form a layer on the back surface side of the substrate, as well. A metal film can also be partially formed. In order to form DTI regions (such as the through DTI regions 22 and the non-through DTI regions 23) with different depths, trenches with different depths are formed by repeating a trench forming step.

A metal film made of tungsten, for example, is deposited on the back surface side of the substrate, and resist patterning and etching are performed. Accordingly, the backside light-shielding film 15 is formed in a predetermined region.

After that, a hole reaching the interconnect layer on the front surface side of the substrate is formed from the back surface side. Deposition of metal such as aluminum, resist patterning, etching, and other processing are sequentially performed to form a metal pad connected to the interconnect layer.

The solid-state imaging device is manufactured in this manner.

INDUSTRIAL APPLICABILITY

The configuration according to the present disclosure allows excellent isolation of a well in a solid-state imaging device provided with a charge trapping layer, and is thus useful for improving the image quality of the solid-state imaging device.

DESCRIPTION OF REFERENCE CHARACTERS

10 Pixel
11 Charge Trapping Layer
11a Charge Trapping Layer
11b Charge Trapping Layer
11d Charge Trapping Layer
12 VDD Region
13 Charge Storage Layer
14 P-Type Layer
15 Backside Light-Shielding Film
16 First Transfer Gate
17 Second Transfer Gate
18 Floating Diffusion
19 STI Region
20 P-Well 21 Terminal
22 Through DTI Region
23 Non-Through DTI Region
23a Non-Through DTI Region
24 Photoelectric Conversion Unit
25 Transistor
26 Deep Well Region
27 Overflow Gate
28 Overflow Drain
30 N+ Layer
31 Extension Region
32 Gate Electrode
40 Intersection Region
41 Region
51 Arrow
42 Region Where No P-Well Is Formed

The invention claimed is:

1. A solid-state imaging device comprising a pixel array where pixels are arranged in a matrix, wherein:
   each of the pixels includes a photoelectric conversion unit configured to generate a signal charge based on incident light, and an element isolation layer having light-shielding properties and surrounding a periphery of the photoelectric conversion unit,
   the element isolation layers of adjacent ones of the pixels in both a row direction and a column direction are isolated from each other,
   a charge storage layer and a charge trapping layer are provided in each of regions between the element isolation layers of the adjacent ones of the pixels in the row direction and the column direction,
   an intersection region charge trapping layer is provided in an intersection region in which a region between columns of the pixels and a region between rows of the pixels intersect each other, the intersection region charge trapping layer partially occupying the intersection region,
   the charge storage layer stores the signal charge, and
   the charge trapping layer reduces incidence of light on the charge storage layer.

2. The solid-state imaging device of claim 1, wherein:
   the intersection region charge trapping layer is not in contact with the charge trapping layer in each of the regions between the element isolation layers.

3. The solid-state imaging device of claim 1, wherein:
   the intersection region charge trapping layer connects the charge trapping layers in the regions between the element isolation layers in the row direction and the column direction.

4. The solid-state imaging device of claim 1, wherein:
   the charge trapping layers are isolated from each other in the row direction and the column direction in the intersection region in which the region between columns of the pixels and the region between rows of the pixels intersect each other.

5. The solid-state imaging device of claim 4, wherein:
   the charge trapping layers are provided except in the intersection region.

6. The solid-state imaging device of claim 1, wherein:
   a low-concentration charge trapping layer is provided in the intersection region in which the region between columns of the pixels and the region between rows of the pixels intersect each other, the low-concentration charge trapping layer having an impurity concentration lower than that of the charge trapping layer in each of the regions between the element isolation layers.

7. The solid-state imaging device of claim 2, wherein:
   a low-concentration charge trapping layer is provided in the intersection region in which the region between columns of the pixels and the region between rows of the pixels intersect each other, the low-concentration charge trapping layer having an impurity concentration lower than that of the charge trapping layer in each of the regions between the element isolation layers.

8. The solid-state imaging device of claim 3, wherein:
   a low-concentration charge trapping layer is provided in the intersection region in which the region between columns of the pixels and the region between rows of the pixels intersect each other, the low-concentration charge trapping layer having an impurity concentration lower than that of the charge trapping layer in each of the regions between the element isolation layers.

9. The solid-state imaging device of claim 1, wherein:
   the charge trapping layer has an extended region that is extended to an outside of a region of the pixel array, and a terminal that takes a potential for the charge trapping layer is provided in the extended region.

10. The solid-state imaging device of claim 2, wherein:
    the charge trapping layer has an extended region that is extended to an outside of a region of the pixel array, and a terminal that takes a potential for the charge trapping layer is provided in the extended region.

11. The solid-state imaging device of claim 3, wherein:
    the charge trapping layer has an extended region that is extended to an outside of a region of the pixel array, and a terminal that takes a potential for the charge trapping layer is provided in the extended region.

12. A solid-state imaging device comprising a pixel array where pixels are arranged in a matrix, wherein:
    each of the pixels includes a photoelectric conversion unit configured to generate a signal charge based on incident light, and an element isolation layer having light-shielding properties and surrounding a periphery of the photoelectric conversion unit,
    the element isolation layers of adjacent ones of the pixels in both a row direction and a column direction are isolated from each other,
    a charge storage layer and a charge trapping layer are provided in each of regions between the element isolation layers of the adjacent ones of the pixels in the row direction and the column direction,
    the charge storage layer stores the signal charge,
    the charge trapping layer reduces incidence of light on the charge storage layer, and
    a low-concentration charge trapping layer is provided in an intersection region in which a region between columns of the pixels and a region between rows of the pixels intersect each other, the low-concentration charge trapping layer having an impurity concentration lower than that of the charge trapping layer in each of the regions between the element isolation layers.

13. The solid-state imaging device of claim 12, wherein:
    the charge trapping layer has an extended region that is extended to an outside of a region of the pixel array, and a terminal that takes a potential for the charge trapping layer is provided in the extended region.

14. A solid-state imaging device comprising a pixel array where pixels are arranged in a matrix, wherein:
    each of the pixels includes a photoelectric conversion unit configured to generate a signal charge based on incident light, and an element isolation layer having light-shielding properties and surrounding a periphery of the photoelectric conversion unit, the element isolation layers of adjacent ones of the pixels in both a row direction and a column direction are isolated from each other, a charge storage layer and a charge trapping layer are provided in each of regions between the element isolation layers of the adjacent ones of the pixels in the row direction and the column direction, the charge storage layer stores the signal charge, the charge trapping layer reduces incidence of light on the charge storage layer, and the charge trapping layer has an extended region that is extended to an outside of a region of the pixel array, and a terminal that takes a potential for the charge trapping layer is provided in the extended region.

15. A solid-state imaging device comprising a pixel array where pixels are arranged at lease one-dimensionally, wherein:

each of the pixels includes a photoelectric conversion unit configured to generate a signal charge based on incident light, a charge storage layer for storing the signal charge, and a charge trapping layer for reducing incidence of light on the charge storage layer, and the charge trapping layer has an extended region that is extended to an outside of a region of the pixel array, and a terminal that takes a potential for the charge trapping layer is provided in the extended region.

* * * * *